United States Patent
Chu et al.

(10) Patent No.: US 7,353,861 B2
(45) Date of Patent: Apr. 8, 2008

(54) TRANSPIRATION COOLED HEAT SINK AND A SELF CONTAINED COOLANT SUPPLY FOR SAME

(75) Inventors: Richard C. Chu, Poughkeepsie, NY (US); Michael J. Ellsworth, Jr., Lagrangeville, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 199 days.

(21) Appl. No.: 11/083,126

(22) Filed: Mar. 17, 2005

(65) Prior Publication Data

US 2005/0162833 A1    Jul. 28, 2005

Related U.S. Application Data

(62) Division of application No. 09/965,037, filed on Sep. 27, 2001, now abandoned.

(51) Int. Cl.
 *F28D 15/00*    (2006.01)
(52) U.S. Cl. .......................... 165/104.22; 165/104.25; 165/104.26; 165/104.33; 361/700; 257/715; 62/259.1; 62/92; 62/304; 62/171
(58) Field of Classification Search ........... 165/104.22, 165/104.25, 104.26, 104.33; 361/700; 257/715; 62/259.1, 92, 304, 171
See application file for complete search history.

(56) References Cited

U.S. PATENT DOCUMENTS 3,165,145 A * 1/1965 Spacing et al. ............. 165/259
4,252,185 A * 2/1981 Kosson ................... 165/104.25
4,635,709 A   1/1987 Altoz
5,208,733 A   5/1993 Besanger
5,603,375 A   2/1997 Salt
6,018,459 A   1/2000 Carlson et al.
6,085,831 A   7/2000 DiGiacomo et al.
6,411,512 B1  6/2002 Mankaruse et al.
6,437,981 B1  8/2002 Newton et al.
6,990,816 B1 * 1/2006 Zuo et al. ..................... 62/3.7

FOREIGN PATENT DOCUMENTS

JP    63140753 A    6/1988
JP    4091459 A     3/1992
JP    8316388       11/1996

* cited by examiner

*Primary Examiner*—Patricia Bianco
*Assistant Examiner*—Nihir Patel
(74) *Attorney, Agent, or Firm*—Cantor Colburn LLP; Lily Neff

(57) ABSTRACT

A transpiration cooled heat sink, a self contained coolant supply and a method of using a transpiration cooled heat sink and a self contained coolant supply is provided and includes a heat sink base structure, the heat sink base structure having a coolant inlet for receiving a coolant and a coolant outlet for distributing a coolant, wherein the heat sink base structure defines at least one coolant channel disposed so as to be communicated with the coolant inlet and the coolant outlet and a coolant distribution structure, wherein the coolant distribution structure defines at least one distribution cavity and includes at least one distribution inlet communicated with the distribution cavity and wherein the coolant distribution structure is disposed relative to the heat sink base structure such that the distribution inlet is communicated with the coolant outlet.

4 Claims, 8 Drawing Sheets

TRANSPIRATION COOLED HEAT SINK AND A SELF CONTAINED COOLANT SUPPLY FOR SAME

CROSS-REFERENCE TO RELATED APPLICATIONS

This application is a divisional of U.S. patent application Ser. No. 09/965,037 filed Sep. 27, 2001, now abandoned the contents of which are incorporated by reference herein in their entirety.

FIELD OF THE INVENTION

The present invention relates generally to a heat sink and more particularly to a transpiration cooled heat sink and a self contained coolant supply for the transpiration cooled heat sink.

BACKGROUND OF THE INVENTION

As an electronic component operates, the signal flow within the component generates heat which if not removed may cause damage. If this heat is not removed, or dissipated, the electronic component may not operate correctly and may become damaged. Typically, the heat generated by the electronic component is dissipated by a cooling means, such as a heat sink which absorbs and dissipates the heat via direct air convection. Heat sinks are well known in the electronics industry and are used extensively to dissipate heat generated by electronic components used in computers and various other electronic equipment.

However, improvements in integrated circuit (IC) design and fabrication techniques are allowing IC manufacturers to produce smaller IC devices and other electronic components which operate at increasingly faster speeds and which perform an increasingly higher number of operations. As the operating speed and operational parameters of an electronic component increases, so to does the heat generated by these components. As a result, heat sinks that use conventional direct air cooling technology, or direct air convection, to dissipate heat are fast approaching the limits of their cooling abilities and it is becoming increasingly difficult to dissipate this increased heat. This is true even for electronic components that were once considered to be a low power technology and as such low heat generators, such as complementary metal oxide semiconductor, or CMOS, circuitry.

Therefore, it would be desirable to provide a cooling means that is capable of dissipating heat generated by various types of current and future generations of electronic components.

SUMMARY OF THE INVENTION

A transpiration cooled heat sink comprising: a heat sink base structure, the heat sink base structure having a coolant inlet for receiving a coolant and a coolant outlet for distributing a coolant, wherein the heat sink base structure defines at least one coolant channel disposed so as to be communicated with the coolant inlet and the coolant outlet; and a coolant distribution structure, wherein the coolant distribution structure defines at least one distribution cavity and includes at least one distribution inlet communicated with the distribution cavity and wherein the coolant distribution structure is disposed relative to the heat sink base structure such that the distribution inlet is communicated with the coolant outlet.

A self contained coolant supply for a transpiration cooled heat sink comprising: a coolant production apparatus, the coolant production apparatus having an airflow inlet for receiving an airflow, an airflow outlet for discharging the airflow, a dehumidification unit for extracting a coolant from the airflow and a product outlet for discharging the coolant; and a coolant storage structure, wherein the coolant storage structure defines a storage cavity for containing the coolant and includes a storage inlet and a storage outlet, wherein the storage inlet is communicated with the storage cavity and the product outlet and wherein the storage outlet is communicated with the storage cavity and a transpiration cooled heat sink.

A method for using a transpiration cooled heat sink and a self contained coolant supply for a transpiration cooled heat sink comprising: obtaining a transpiration cooled heat sink having a coolant inlet, a self contained coolant supply for a transpiration cooled heat sink having a dehumidification unit, a coolant storage structure and a storage outlet and an electronic system which includes at least one electronic device having a device outer surface; positioning the self contained coolant supply within the electronic system so as to receive an airflow; attaching the transpiration cooled heat sink to the electronic device so as to communicate the transpiration cooled heat sink with the device outer surface; communicating the coolant inlet with the storage outlet; and operating the self contained coolant supply so as to produce a coolant.

DETAILED DESCRIPTION OF THE INVENTION

Figure 1:
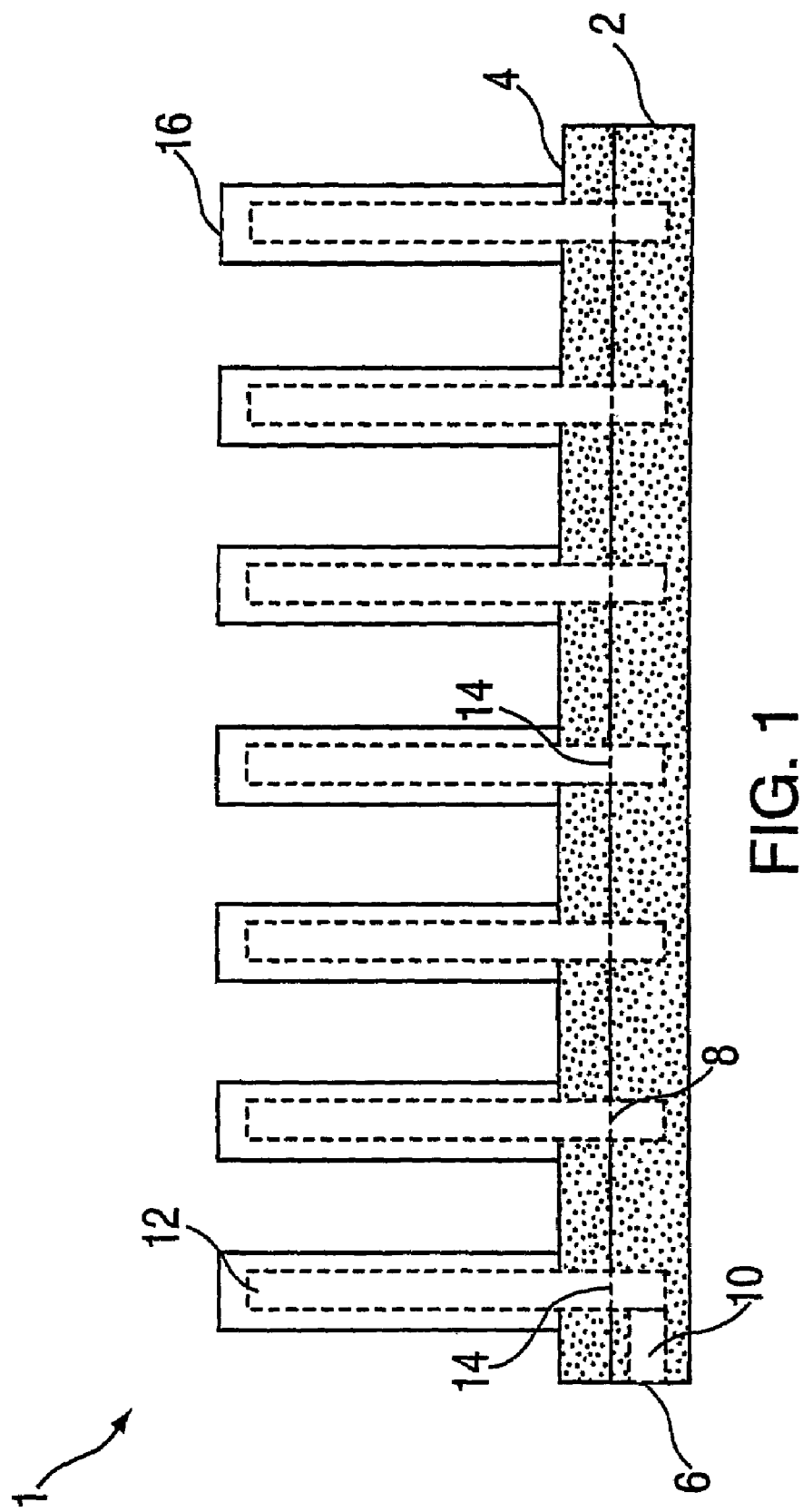
FIG. 1 is a side cross sectional view of a transpiration cooled heat sink in accordance with an embodiment of the invention.

Referring to the drawings, FIG. 1 illustrates a transpiration cooled heat sink 1 in accordance with an embodiment of the invention and preferably includes a heat sink base structure 2 and a coolant distribution structure 4. The heat sink base structure 2 preferably includes a coolant inlet 6, a coolant outlet 8 and a coolant channel 10 communicated with coolant inlet 6 and coolant outlet 8. The coolant distribution structure 4 preferably defines a distribution cavity 12 and includes a distribution inlet 14 communicated with distribution cavity 12 and at least one distribution member 16, and preferably a plurality of distribution members 16, wherein distribution member 16 is constructed such that distribution cavity 12 is disposed within the distribution member 16.

Figure 2:
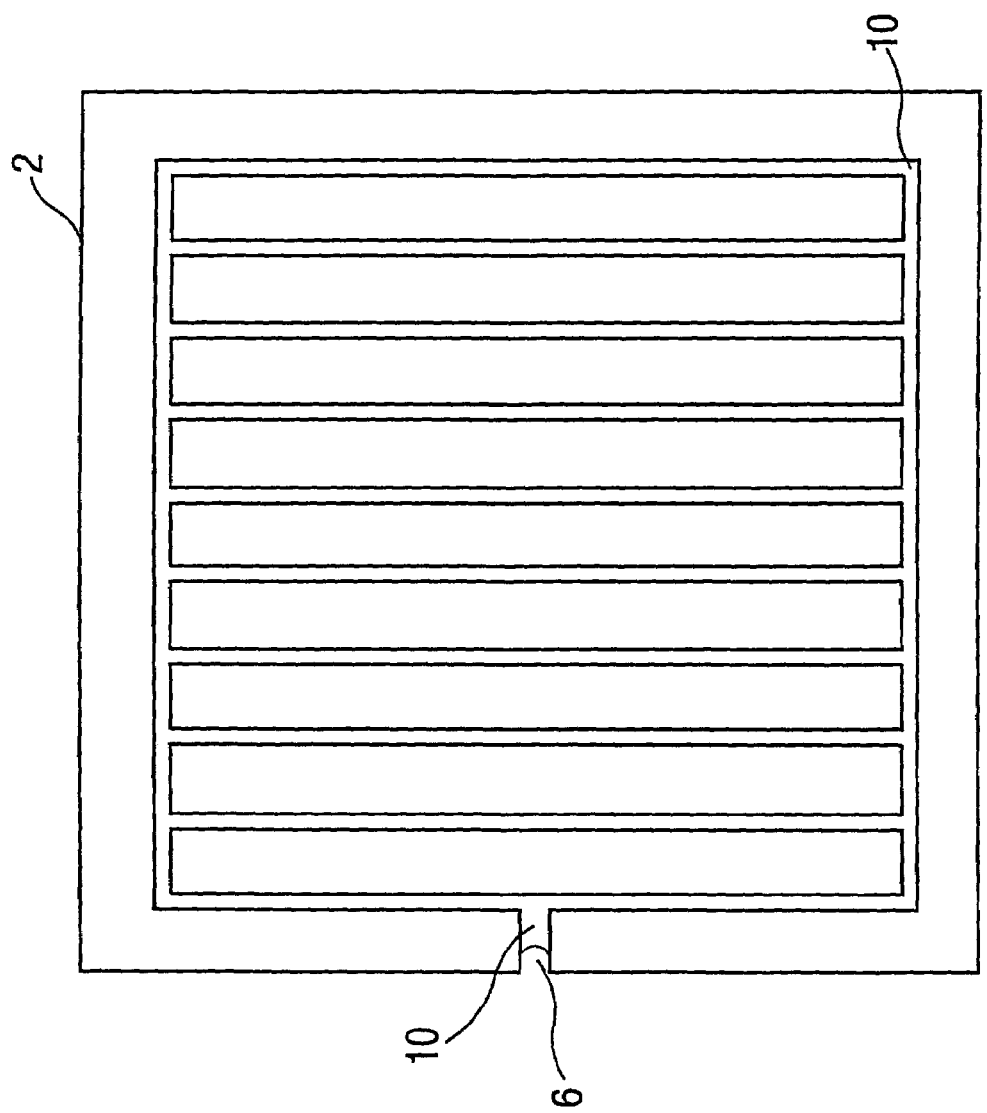
FIG. 2 is a top down cross sectional view of a transpiration cooled heat sink showing the heat sink base structure and the coolant channel in a square pattern in accordance with an embodiment of the invention.
Figure 3:
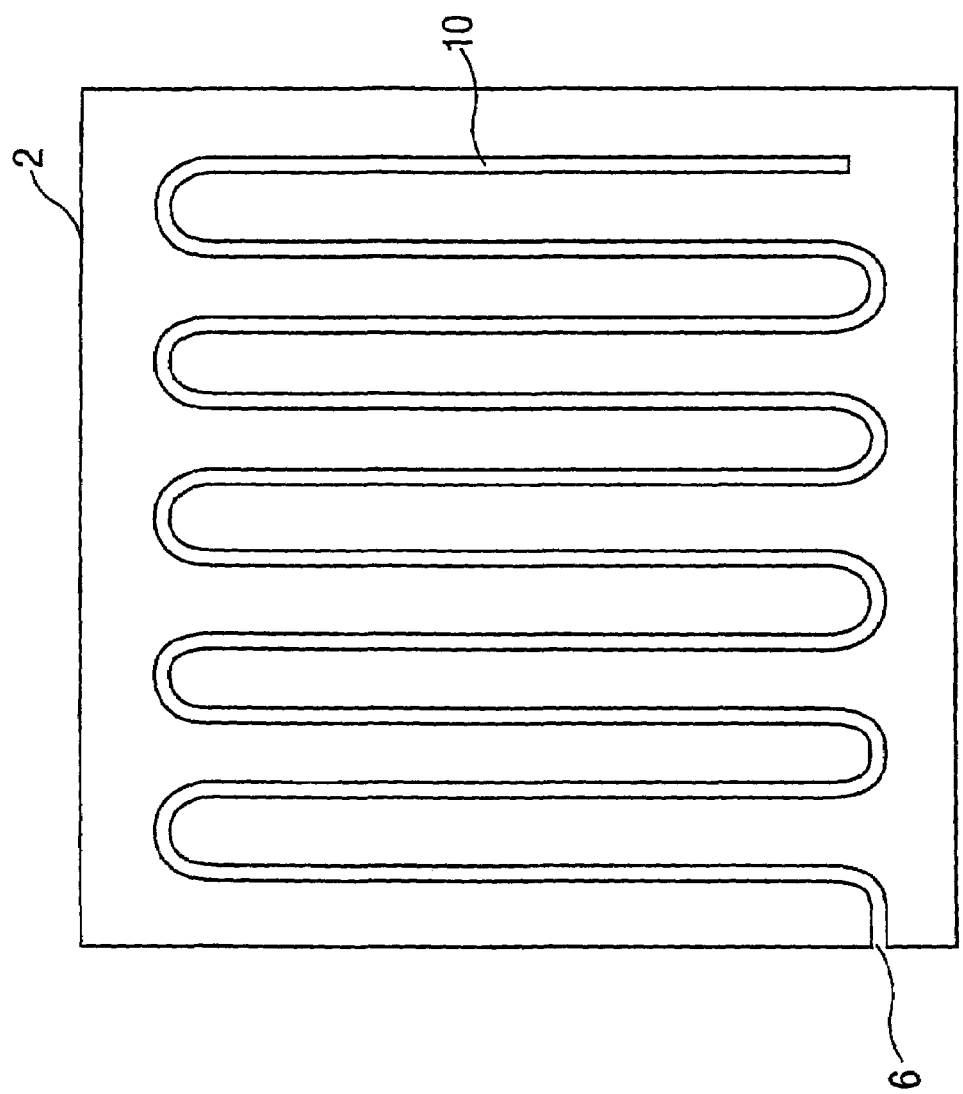
FIG. 3 is a top down cross sectional view of a transpiration cooled heat sink showing heat sink base structure and the coolant channel in a serpentine or "S" shaped pattern in accordance with an embodiment of the invention.

In accordance with an embodiment of the invention, heat sink base structure 2 is preferably non-movably associated with coolant distribution structure 4 and disposed relative to coolant distribution structure 4 such that distribution inlet 14 is communicated with coolant outlet 8. In accordance with an embodiment of the invention, coolant channel 10 may be of any shape that is suitable to the desired end purpose. Examples of this can be seen in FIG. 2 and FIG. 3. Referring to FIG. 2, a heat sink base structure 2 is shown having a coolant channel 10 forming a square pattern within heat sink base structure 2. Referring to FIG. 3, a heat sink base structure 2 is shown having a coolant channel 10 forming a serpentine or "S" shaped pattern within heat sink base structure 2.

In accordance with an embodiment of the invention, heat sink base structure 2 and coolant distribution structure 4 are preferably non-movably associated with each other and may be connected together via any attaching device (e.g. screws, bolts, clips) or any attaching method (e.g. soldering, brazing) known in the art and suitable to the desired end purpose.

In accordance with an embodiment of the invention, heat sink base structure 2 is preferably constructed from any solid material known in the art and suitable to the desired end purpose having sufficient rigidity and thermal characteristics, such as copper or aluminum.

In accordance with an embodiment of the invention, coolant distribution structure 4 and/or distribution member 16 are preferably constructed from any porous material known in the art and suitable to the desired end purpose, such as copper or aluminum. In addition, coolant distribution structure 4 and/or distribution member 16 may be formed by sintered powder metallurgy or foam metal technologies.

Figure 4:
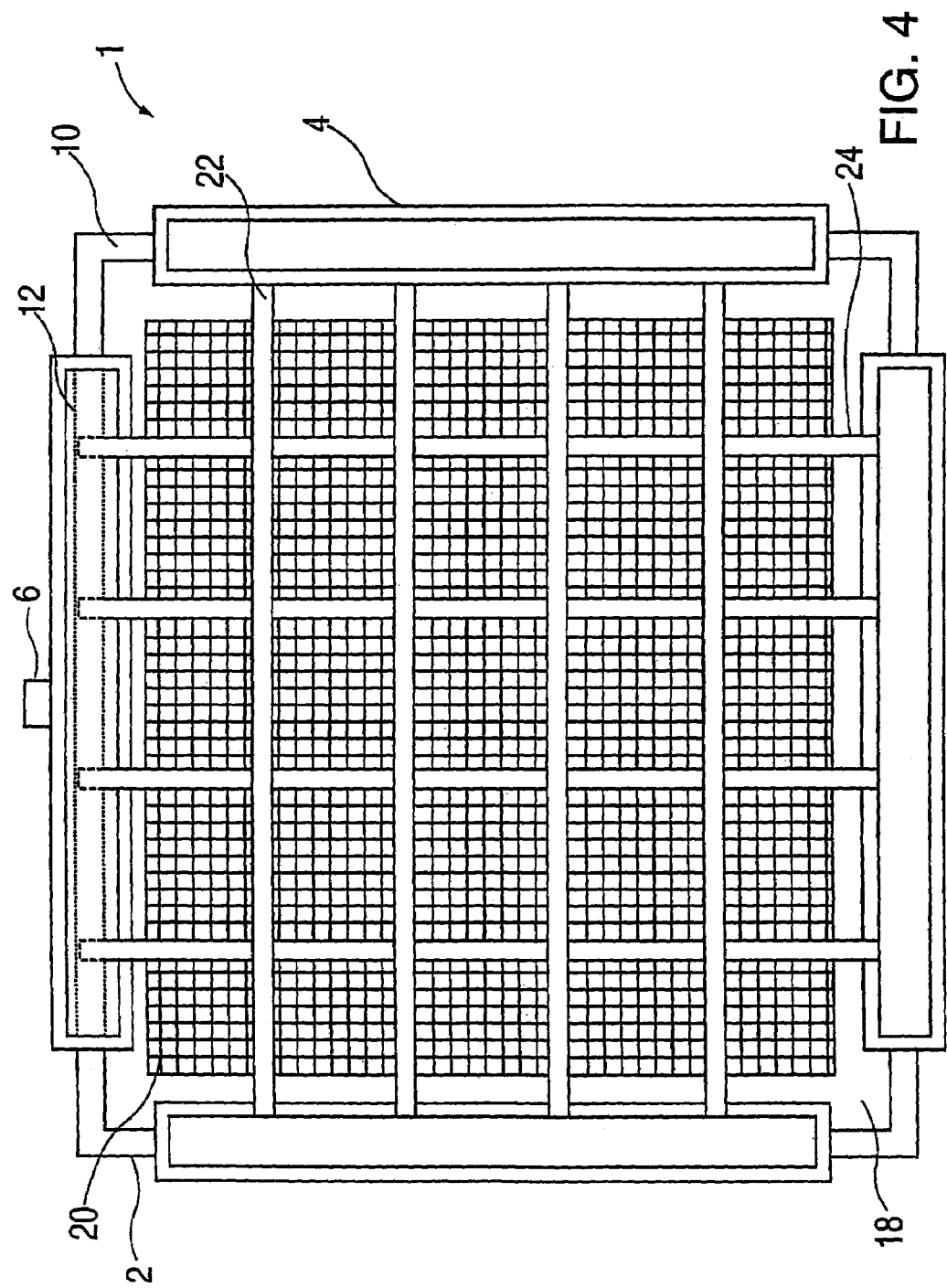
FIG. 4 is a top down cross sectional view showing an alternative embodiment of a transpiration cooled heat sink in accordance with an embodiment of the invention.
Figure 5:
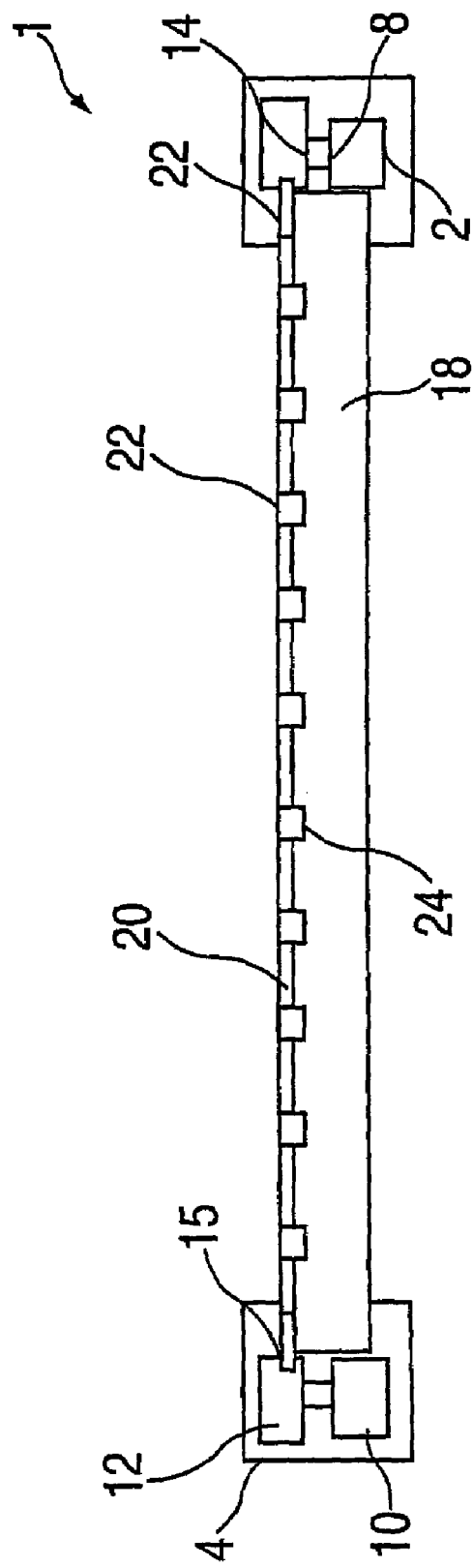
FIG. 5 is a side cross sectional view of an alternative embodiment of a transpiration cooled heat sink in accordance with an embodiment of the invention.

Referring to FIG. 4 and FIG. 5, an alternative embodiment of a transpiration cooled heat sink 1 is illustrated in accordance with an embodiment of the invention and preferably includes a heat sink base structure 2 and a coolant distribution structure 4. The heat sink base structure 2 preferably includes a coolant inlet 6, a coolant outlet 8 and a coolant channel 10 communicated with coolant inlet 6 and coolant outlet 8. The coolant distribution structure 4 preferably defines a distribution cavity 12 and includes a distribution inlet 14 communicated with distribution cavity 12 and coolant outlet 8. Coolant distribution structure 4 also preferably includes a distribution outlet 15 disposed so as to be communicated with distribution cavity 12. In addition, heat sink base structure 2 further includes a module attachment structure 18 having a plurality of module channels 24 disposed so as to be communicated with distribution outlet 15. Module attachment structure 18 also preferably includes a heat transfer surface 20 which is preferably non-movably attached to module attachment structure 18 and disposed so as to be communicated with plurality of module channels 24. Coolant distribution structure 4 also includes a coolant distribution device 22 disposed within module channels 24 so as to be communicated with distribution outlet 15 and heat transfer surface 20. This allows distribution cavity 12 to be communicated with coolant distribution device 22 via distribution outlet 15 for coolant distribution.

In accordance with an embodiment of the invention, heat transfer surface 20 is preferably constructed from a porous metal surface, such as copper or aluminum. In addition, heat transfer surface 20 may be formed by sintered powder metallurgy or foam metal technologies.

In accordance with an embodiment of the invention, coolant distribution device 22 is preferably constructed from a wicking material having suitable absorption properties, such as cotton string.

In accordance with an embodiment of the invention, module attachment structure 18 and heat transfer surface 20 are preferably non-movably associated with each other and may be connected together via any attaching device (e.g. screws, bolts, clips) or any attaching method (e.g. soldering, brazing) known in the art and suitable to the desired end purpose.

Figure 6:
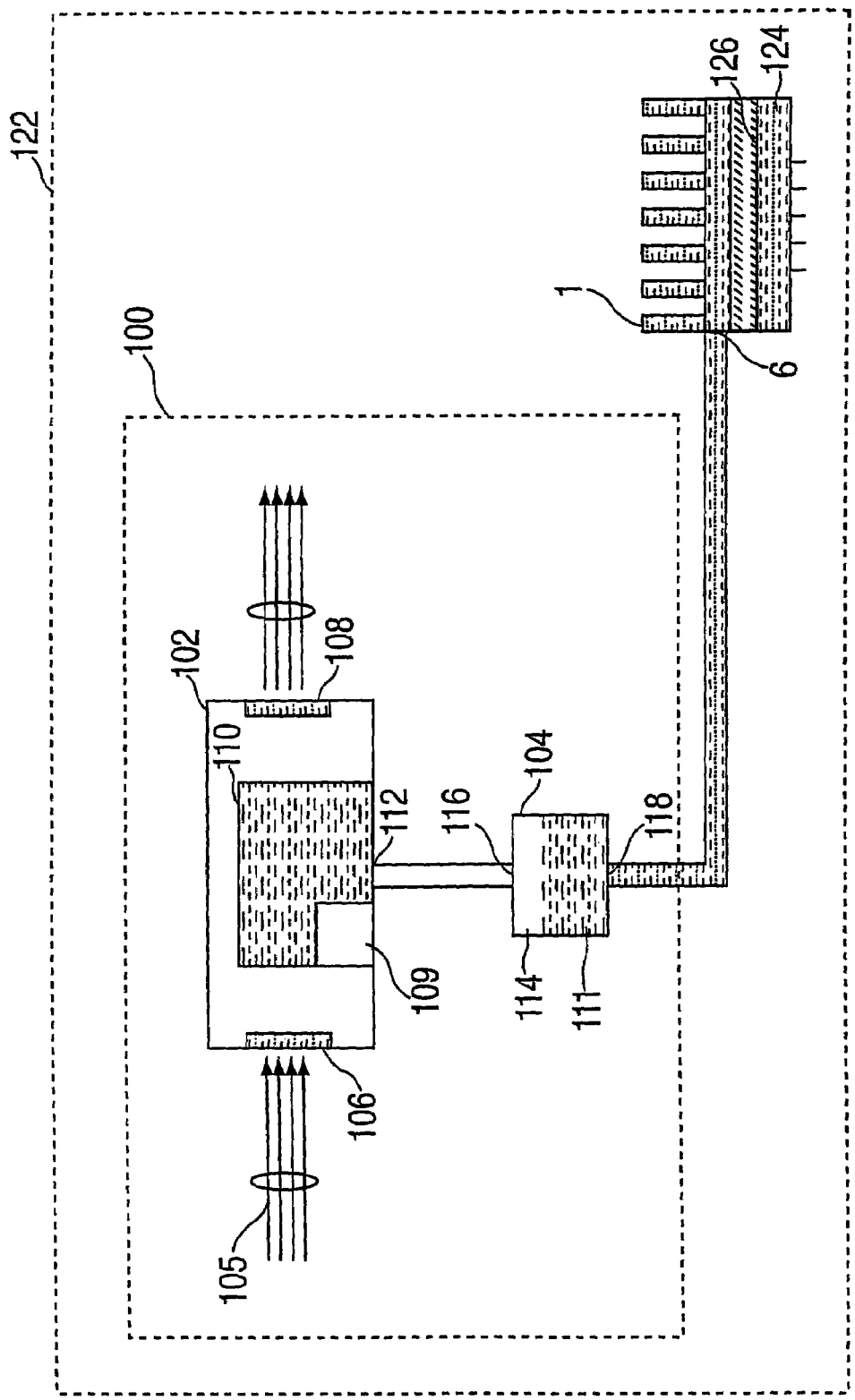
FIG. 6 is a functional diagram illustrating a self contained coolant supply communicated with a transpiration cooled heat sink in accordance with an embodiment of the invention.
Figure 7:
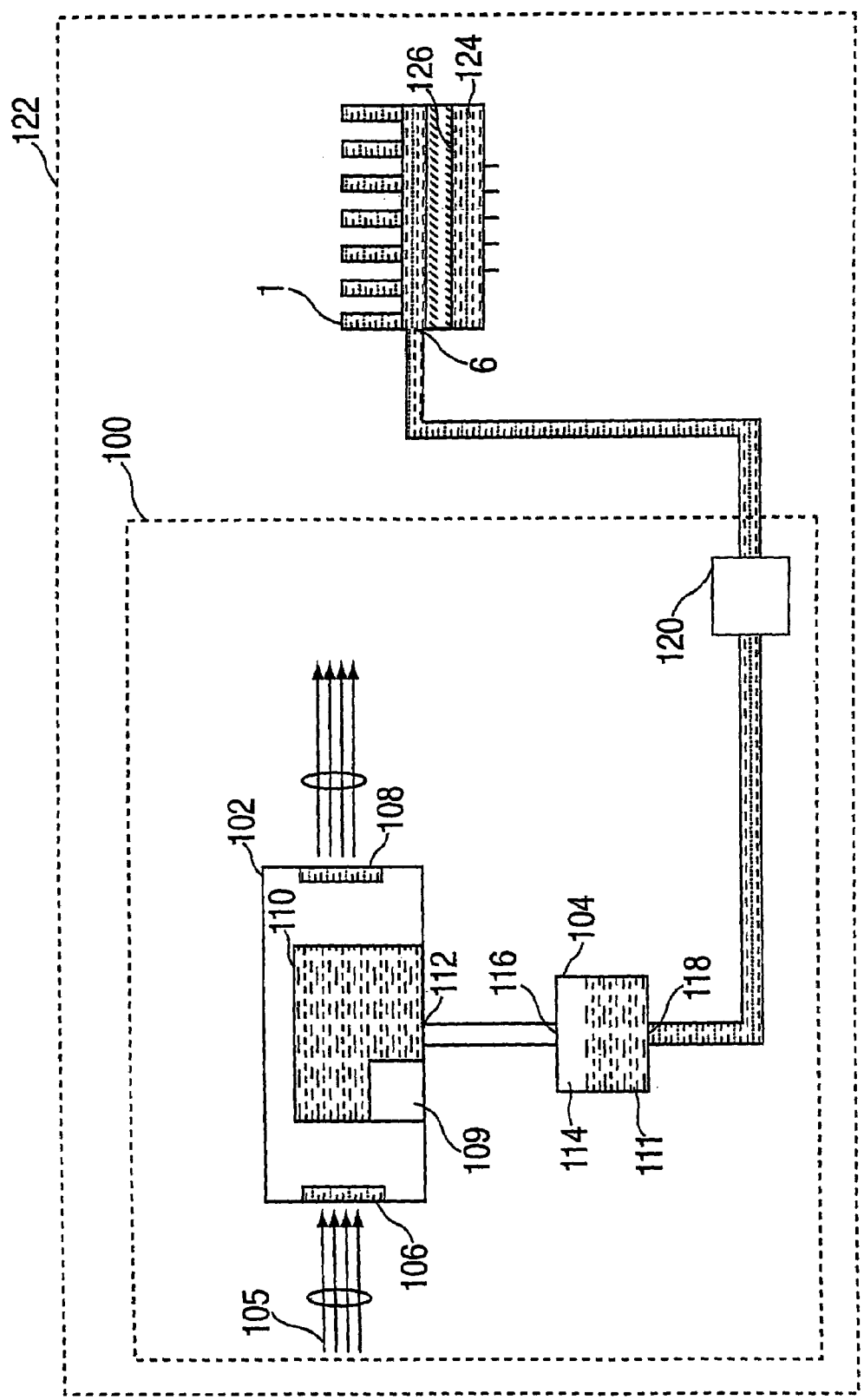
FIG. 7 is a functional diagram illustrating a self contained coolant supply employing a coolant pump communicated with a transpiration cooled heat sink in accordance with an embodiment of the invention.
Figure 8:
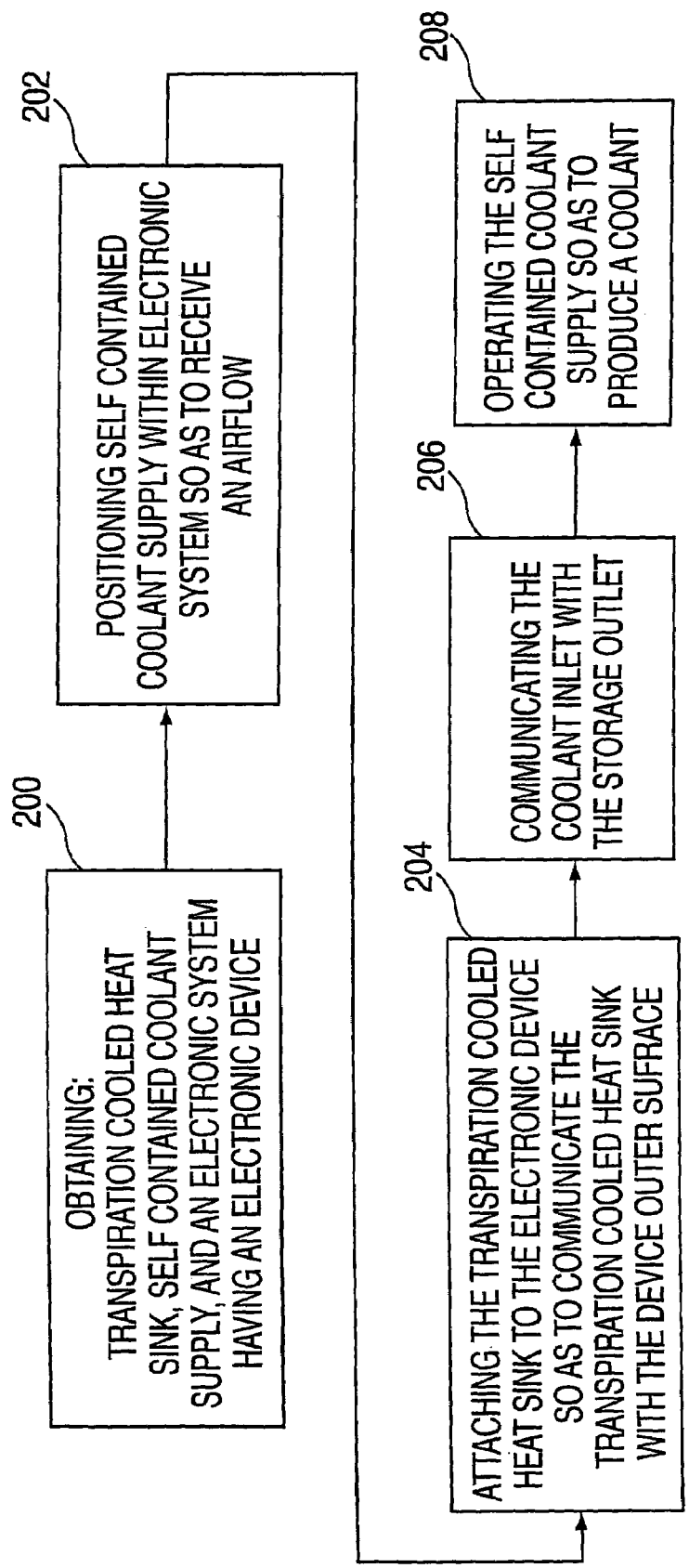
FIG. 8 is a flow chart of a method for using a transpiration cooled heat sink and a self contained coolant supply in accordance with an embodiment of the invention.

Referring to FIG. 6 and FIG. 7, a self contained coolant supply for a transpiration cooled heat sink 100 is illustrated and preferably includes a coolant production apparatus 102 and a coolant storage structure 104. In accordance with an embodiment of the invention, coolant production apparatus 102 includes an airflow inlet 106 for receiving an airflow 105, an airflow outlet 108 for discharging airflow 105, a dehumidification unit 110 for extracting a coolant 111 from airflow 105 and a product outlet 112 communicated with dehumidification unit 110 for discharging a coolant 111. It is considered within the scope of the invention, that airflow 105 to airflow inlet 106 may be provided by an external source drawing in outside air, such as a fan, or may be self contained. If airflow 105 to airflow inlet 106 is a self contained airflow 105, the moist air evaporated from transpiration cooled heat sink 1 is circulated into airflow inlet 106 and dehumidified allowing coolant 111 to be recycled and reused. Dehumidification unit 110 preferably includes a control device 109 for controlling the on/off power supplied to dehumidification unit 110. In accordance with an embodiment of the invention, control device 109 is preferably connected to an external power source, but it is considered within the scope of the invention that control device 109 may contain an internal power source.

Moreover, dehumidification unit 110 is preferably disposed within coolant production apparatus 102 so as to be communicated with airflow inlet 106 so as to receive airflow 105. Coolant storage structure 104 preferably defines a storage cavity 114 and includes a storage outlet 118 and a storage inlet 116 communicated with product outlet 112, wherein storage inlet 116 and storage outlet 118 are disposed so as to be communicated with storage cavity 114. A coolant level measuring device may be provided for measuring the level of coolant within storage cavity 114. In accordance with an embodiment of the invention, any coolant level measuring device known within the art and suitable to the desired end purpose may be used.

In addition, self contained coolant supply for a transpiration cooled heat sink 100 is preferably disposed so that storage outlet 118 is preferably communicated with coolant inlet 6 of a transpiration cooled heat sink 1, wherein a coolant contained within storage cavity 114 is communicated with coolant inlet 6 via a gravity feed process. However, as shown in FIG. 7, if desired a coolant pump 120 may be used to communicate a coolant from storage cavity 114 to coolant inlet 6.

In accordance with an embodiment of the invention, coolant pump 120 is preferably a centrifugal pump. However, coolant pump 120 may be any pumping device known in the art and suitable to the desired end purpose.

In accordance with an embodiment of the invention, product outlet 112 is preferably communicated with storage inlet 116 via any communication device known in the art and suitable to the desired end purpose, such as copper tubing or rubber tubing. Also, in accordance with an embodiment of the invention, storage outlet 118 is preferably communicated with coolant inlet 6 via any communication device known in the art and suitable to the desired end purpose, such as copper tubing or rubber tubing.

Referring to the figures, a method for using a transpiration cooled heat sink 1 and a self contained coolant supply for a transpiration cooled heat sink 100 is illustrated in accordance with an embodiment of the invention. As shown in step 200 a transpiration cooled heat sink 1 having a coolant inlet 6, a self contained coolant supply for a transpiration cooled heat sink 100 having a storage outlet 118 and an electronic system 122 which includes at least one electronic device 124 having a device outer surface 126 is obtained.

Self contained coolant supply 100 is then positioned within electronic system 122 so as to receive an airflow 105, as in step 202. In accordance with an embodiment of the invention, self contained coolant supply 100 is disposed within electronic system 122 so as to communicate airflow 105 with airflow inlet 106. Transpiration cooled heat sink 1 is then attached to electronic device 126 so as to be communicated with device outer surface 126, as in step 204. Self contained coolant supply 100 is then communicated with transpiration cooled heat sink 1 as in step 206 by communicating storage outlet 118 with coolant inlet 6. Electronic system 122 is then operated so as to cause electronic device 124 to heat up. Self contained coolant supply 100 is then operated, as in step 208, so as to cause dehumidification unit 110 to begin extracting coolant 111 from airflow 105 and storing coolant 111 into storage cavity 114.

In accordance with an embodiment of the invention, if storage cavity 114 does not contain an adequate amount of coolant 111 to cool electronic device 124, coolant 111 may be introduced into storage cavity 114 manually via an external source, or by dehumidification unit 110 which may be operated prior to the operation of electronic system 122 so as to allow for the generation and storage of coolant 111. This may be necessary upon initial use of self contained coolant supply for a transpiration cooled heat sink 100 because dehumidification unit 110 has not been operated so as to generate coolant 111 and thus storage cavity 114 does not contain a sufficient amount of coolant 111 to safely operate electronic device 124.

In accordance with an embodiment of the invention, coolant 111 is preferably water. However, coolant 111 may be any coolant known in the art and suitable to the desired end purpose.

In accordance with an embodiment of the invention, transpiration cooled heat sink 1 is preferably attached to electronic device 124 using any known attaching device known in the art and suitable to the desired end purpose, such as a clip.

Referring to FIG. 1, FIG. 6, FIG. 7 and FIG. 8, as dehumidification unit 110 begins to extract a coolant 111 from airflow 105, coolant 111 will be stored within storage cavity 114. Coolant 111 will then flow through storage outlet 118 into coolant inlet 6 via gravity feed. However, if desired a coolant pump 120 may be used to aid or create coolant flow from storage outlet 118 into coolant inlet 6. As coolant 111 flows through coolant inlet 6, coolant 111 flows into coolant channel 10 and out of coolant outlet 8 into distribution cavity 12. As electronic device 124 operates, the heat generated by electronic device 124 flows through device outer surface 126 into transpiration cooled heat sink 1 causing coolant 111 contained within distribution cavity 12 to permeate the porous metal structure of distribution member 16 to its outer surface where it can evaporate into the unsaturated air flowing over the outer surface of distribution member 16. Evaporated coolant 111 is then replaced via gravity feed or via a coolant pump 120, as discussed hereinabove.

In accordance with an embodiment of the invention, transpiration cooling occurs when the unsaturated airflow 105 flows over the coolant 111 that is disposed on the outer surface of distribution member 16. Under this condition, the coolant 111 readily evaporates into the unsaturated airflow 105 whereby both mass, in this case coolant 111 in the form of vapor, and heat are transferred to the airflow 105. This heat, termed latent heat, is transferred by virtue of the change in coolant phase, i.e. coolant 111 changing from a liquid to a vapor. Sensible heat is also transferred by virtue of the temperature difference between outer surface of distribution member 16 and airflow 105, wherein the outer surface of distribution member 16 is higher in temperature than airflow 105. Since the transfer for latent heat does not result in an increase in temperature, the thermal performance of transpiration cooled heat sink 1 is significantly increased over conventionally cooled heat sinks. As the coolant 111 which is disposed on the outer surface of distribution member 16 evaporates, coolant 111 is replenished by a combination of capillary action within distribution member 16 and by the pressure on coolant 111 within distribution member 16 due to gravity and/or coolant pump 120.

Referring to FIG. 4, FIG. 5, FIG. 6, FIG. 7 and FIG. 8, an alternative embodiment of a transpiration cooled heat sink 1 is discussed. As dehumidification unit 110 begins to extract a coolant 111 from airflow 105, coolant 111 will be stored within storage cavity 114. Coolant 111 will then flow through storage outlet 118 into coolant inlet 6 via gravity feed. However, if desired a coolant pump 120 may be used to aid or create coolant flow from storage outlet 118 into coolant inlet 6. As coolant 111 flows through coolant inlet 6, coolant 111 flows into coolant channel 10 and out of coolant outlet 8 into distribution cavity 12. Coolant 111 then contacts coolant distribution device 22 disposed within module channels 24 and is absorbed via capillary action into coolant distribution device 22. Coolant is then distributed over the heat transfer surface 20 by coolant distribution device 22. As electronic device 124 operates, the heat generated by electronic device 124 flows through device outer surface 126 into module attachment structure 18 and into heat transfer surface 20 causing coolant 111 disposed on heat transfer surface 20 to evaporate into the unsaturated air flowing over the outer surface of transpiration cooled heat sink 1. Evaporated coolant 111 is then replaced via gravity feed or via a coolant pump 120.

It is considered within the scope of the invention, that multiple transpiration cooled heat sinks 1 may be cooled simultaneously by a single or multiple self contained coolant supplies 100. This may be done by communicating multiple coolant inlets 6 with storage outlet 118.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

We claim:

1. A self contained coolant supply system comprising:
   a transpiration cooled heat sink evaporating coolant via heat produced by an electronic device to produce vaporized coolant;
   a coolant production apparatus, said coolant production apparatus having an airflow inlet for receiving an airflow including said vaporized coolant, an airflow outlet for discharging said airflow, a dehumidification unit for extracting a coolant from said airflow and a product outlet for discharging said coolant; and
   a coolant storage structure, wherein said coolant storage structure defines a storage cavity for containing said coolant and includes a storage inlet and a storage outlet, wherein said storage inlet is communicated with said storage cavity and said coolant outlet and wherein said storage outlet is communicated with said storage cavity and a transpiration cooled heat sink;
   wherein said dehumidification unit includes a control device communicated with a power source.

2. A self contained coolant supply system according to claim 1, further comprising a pumping device disposed so as to be communicated in series fashion with said storage outlet and said transpiration cooled heat sink.

3. A self contained coolant supply system according to claim 2, wherein said pumping device is a centrifugal pump.

4. A self contained coolant supply system comprising:
   a transpiration cooled heat sink evaporating coolant via heat produced by an electronic device to produce vaporized coolant;
   a coolant production apparatus, said coolant production apparatus having an airflow inlet for receiving an airflow including said vaporized coolant, an airflow outlet for discharging said airflow, a dehumidification unit for extracting a coolant from said airflow and a product outlet for discharging said coolant; and
   a coolant storage structure, wherein said coolant storage structure defines a storage cavity for containing said coolant and includes a storage inlet and a storage outlet, wherein said storage inlet is communicated with said storage cavity and said coolant outlet and wherein said storage outlet is communicated with said storage cavity and a transpiration cooled heat sink;
   wherein said dehumidification unit is disposed within said coolant production apparatus so as to be communicated with said airflow inlet.

* * * * *